United States Patent [19]

Paal

[11] Patent Number: 5,051,814
[45] Date of Patent: Sep. 24, 1991

[54] METHOD OF PROVIDING STRESS-FREE THERMALLY-CONDUCTING ATTACHMENT OF TWO BODIES

[75] Inventor: Adam F. Paal, Stanford, Calif.

[73] Assignee: The Board of Trustees of the Leland Stanford Junior University, Stanford, Calif.

[21] Appl. No.: 303,049

[22] Filed: Jan. 25, 1989

Related U.S. Application Data

[63] Continuation of Ser. No. 38,514, Apr. 15, 1987, abandoned.

[51] Int. Cl.⁵ ............................................. H01L 23/40
[52] U.S. Cl. .................................. 357/81; 165/104.33
[58] Field of Search ............................ 357/80, 81, 82; 165/133, 80.2, 80.4, 104.33

[56] References Cited

U.S. PATENT DOCUMENTS

| | | | |
|---|---|---|---|
| 3,953,877 | 4/1976 | Sigusch et al. | 357/72 |
| 4,376,287 | 3/1983 | Sechi | 357/80 |
| 4,567,505 | 1/1986 | Pease et al. | 357/81 |

*Primary Examiner*—William D. Larkins
*Attorney, Agent, or Firm*—Henry K. Woodward

[57] ABSTRACT

A body having a surface for facilitating liquid adherence includes a substrate and a layer of etchable material on a surface of the substrate. Grooves having re-entrant surfaces are formed in the layer of material. In one embodiment, a heat sink for a semiconductor integrated circuit includes a heat-conducting body having a major surface and a grooved layer of a polymer on the major surface. The layer of polymer is encased in a metal layer which provides strength and electrical and thermal conductance. Reactive ion etching can be employed to form the grooves in the polymer, and metal sputtering and electroless plating can be employed to form a composite metal layer.

11 Claims, 1 Drawing Sheet

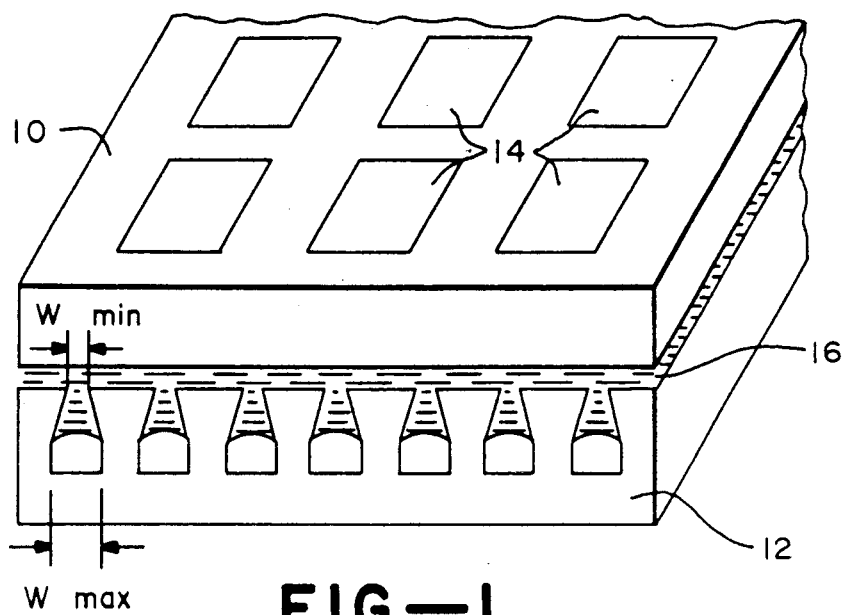
FIG.—1
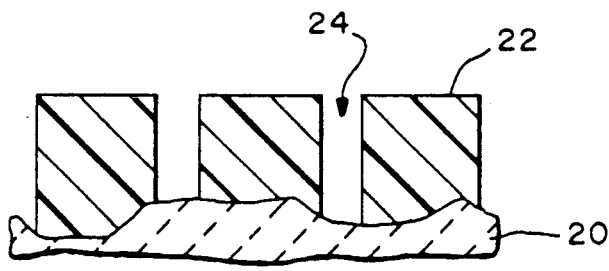
FIG.—2A
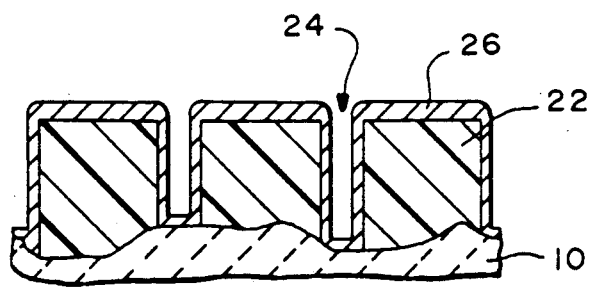
FIG.—2B
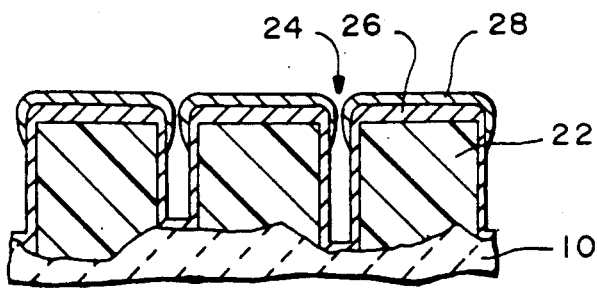
FIG.—2C

METHOD OF PROVIDING STRESS-FREE THERMALLY-CONDUCTING ATTACHMENT OF TWO BODIES

This is a continuation of application Ser. No. 038,514 filed Apr. 15, 1987 now abandoned.

BACKGROUND OF THE INVENTION

This invention relates generally to the mounting of two bodies, and more particularly the invention relates to the attachment of semiconductor devices to a substrate.

Semiconductor chip cooling requirements are increasing with circuit density, size, and speed. Integrated circuits generating as much as 40 W/cm$^2$ have been fabricated; power densities as high as 100 W/cm$^2$ are predicted. Thus, practical cooling of high-power VLSI and ULSI circuits will depend on highly conductive thermal interfaces and chip attachments. Forced air cooling is inadequate for keeping such circuits within safe operating temperatures.

Disclosed in U.S. Pat. No. 4,567,505 is a improved heat sink wherein the heat sink and an integrated circuit are maintained in a low-stress and high-thermal-conductance abutment by pressure from capillary attraction. A surface of one of the two bodies is provided with grooves having reentrant surfaces. A surface of the other both is brought into abutment with the grooved surface, with a liquid therebetween which partially fills the grooves. The grooves act as reservoirs for excess liquid so that a minimum-thickness liquid interface is achieved, and the grooves enable trapped gas to escape out the open ends, thereby preventing a void between the two bodies. Importantly, the groove geometry enforces a well-defined attractive force between the two surfaces due to the liquid surface tension. The grooves in the device surface are formed by chemically etching the surface of the heat sink or the semiconductor substrate. This is satisfactory for bodies such as a wafer of semiconductor material having a smooth planar surface. However, the process is not suitable for materials having rough surfaces or which are not easily etched.

SUMMARY OF THE INVENTION

Accordingly, an object of the present invention is an improved method of attaching two solid bodies.

Another object of the invention is a low-stress attachment of a semiconductor device to a substrate.

Still another object of the invention is the lowstress attachment of a semiconductor device and substrate with enhanced electrical and thermal conductance.

Another object of the invention is an improved heat sink having a grooved surface with the grooves having reentrant surfaces.

A feature of the invention is the ability to use a variety of heat sink materials with the heat sinks having grooves with reentrant surfaces therein.

Briefly, in providing a stress-free attachment of two bodies, a surface of at least one of the bodies is provided with a layer of material that is etchable and exhibits a planar top surface and a conforming surface adhering to the surface of the body. The layer has grooves in the top surface with each groove having a re-entrant surface. The grooves can be formed by etching the layer of material and then encasing the etched layer in metal or other conducting and reinforcing material, which provides mechanical strength as well as electrical and thermal conductance. The reinforcing material is not necessary if the etched layer has sufficient conductance and mechanical strength. Both bodies can have similar grooved surfaces. For example, the back surface of an integrated chip or a semiconductor wafer can be grooved along with a fixture for transporting the chip or wafer or a heat sink for dissipating heat generated by the chip.

In one embodiment, a heat sink body is provided having a surface intended to abut a heat source. A thin layer of material is adhesively applied to the surface. The material can be a polymer such as photoresist or polyimide. Microscopic grooves are then formed in the layer by suitable means such as reactive ion etching. Advantageously, material can be applied to a rough, uneven substrate surface and the surface of the layer provides the requisite smooth surface for interfacing with an integrated circuit wafer or the like.

Thereafter, in a preferred embodiment the ribs of the grooved surface are encased by metal sputtering, for example. The encased ribs can then be electrolessly metal-plated to form or enhance the reentrant groove surfaces.

Advantageously, the heat sink is not limited to materials that can be etched, since the grooves are formed in the thin-layer material applied to the heat sink surface. Further, the heat sink surface can be rough and need not be polished.

The invention and objects and features thereof will be made readily apparent from the following detailed description and appended claims when taken with the drawing.

BRIEF DESCRIPTION OF THE DRAWING

FIG. 1 is a perspective view of a semiconductor circuit and a heat sink with grooves having reentrant surfaces.

FIGS. 2A–2C are section views of a portion of a heat sink in accordance with one embodiment of the invention, illustrating steps in fabricating the heat sink.

DETAILED DESCRIPTION OF ILLUSTRATIVE EMBODIMENTS

Referring now to the drawing, FIG. 1 is a perspective view illustrating a semiconductor integrated circuit 10 and a heat sink 12 as disclosed in U.S. Pat. No. 4,567,505. The integrated circuit 10 comprises a single-crystal semiconductor material such as silicon having a major surface in which circuit components, shown generally at 14, are formed The opposite surface of the integrated circuit 10 mates with a mating surface of the heat sink 12 with a liquid 16 functioning as a thermal interface medium therebetween. The mating surface of the heat sink 12 includes a set of long, parallel and ope-nended microscopic reentrant capillaries 18, which are partially filled with the thermal interface liquid medium 16. The heat sink 12 preferably comprises a material having high thermal conductance, such as silicon, in which the microscopic capillaries 18 are formed by etching. The thermal interface medium preferably has low vapor pressure, good wetting characteristics with the materials of the integrated circuit 10 and heat sink 12, a wide operating temperature range, high surface tension, and high thermal conductance. Silicone oil has proved to be satisfactory. In one embodiment, capillaries have a minimum width, $W_{min}$, of one micron at the top and a maximum width, $W_{max}$, of five microns hear the bottom, with the depth of the capillaries on the order of 30 microns.

In order to have good adhesion of the two mating surfaces and heat transfer therebetween, the mating surface of the heat sink must be smooth. Thus, polishing of the heat sink surface as disclosed in the patent is required. However, many materials such as ceramics as are commonly used for integrated circuit supports are not readily polished as is semiconductor material. Further, many materials having good thermal conductance are not readily etched to form the microscopic grooves as is semiconductor material.

Accordingly, in accordance with the present invention, a heat sink body is provided having a major surface intended to abut a heat source with the surface having a thin layer of material adhesively applied thereto. The material should be etchable and exhibit a planar top surface and a conforming lower surface when applied to the surface of the heat sink body. The material can be a polymer such as photoresist or polyimide in which microscopic grooves are readily formed by reactive ion etching. Advantageously, the material can be applied to a rough, uneven substrate surface such as a ceramic or an unpolished semiconductor and the thin layer of material provides the requisite smooth surface for interfacing with an integrated circuit wafer and the like.

FIGS. 2A-2C are section views of a portion of a substrate 20 having a rough surface on which a thin layer of a patterned polymer 22 is formed. As shown in FIG. 2A, grooves 24 are formed in the polymer by ion etching, as described above, thereby forming ribs having a height and width on the order of 15 microns in the illustrated embodiment. The grooves between the ribs are on the order of 5 microns, as illustrated. In one embodiment the polymer is AZ 4620 photoresist. Other polymers such as polyimide can be used.

The polymer can be applied by spinning or dipping to achieve a polymer thickness equal to the desired channel depth. Alternatively, a solid film such as Riston film manufactured by DuPont can be applied to the surface. The polymer is be baked sufficiently to prevent outgassing during subsequent low-pressure and high-temperature processing and enhance the adhesion and physical strength of the layer on the surface of the heat sink body.

In defining the pattern for flowing plasma reactive ion etching, a layer of silicon can be deposited on the surface of the polymer and then chemically etched using photolithography techniques to define the pattern for the grooves in the polymer.

As illustrated in FIG. 2B, a layer 26 of a composite metal is sputtered over the ribs to provide strength and electrical and heat conductance. In one embodiment, a 300 Angstrom layer of chromium is first sputtered on the polymer ribs to promote adhesion, followed by a 3 micron layer of copper to facilitate heat transfer and enhance the layer strength, and then a 300 Angstrom layer of chromium is sputtered over the copper to protect the copper from oxidation. The etching and sputtering steps are preferably done together without breaking vacuum to ensure optimum adhesion between layers.

Finally, as shown in FIG. 2C, the encased ribs can be subsequently metal-plated to form a layer 28 on the top surface of the ribs and the upper portions of the grooved surfaces. Electroless nickel plating also can be employed. By immersing the heat sink in a plating solution, the channel geometry inhibits the replenishment of of depleted plating solution in the channel bottoms. Thus, the plating rate is suppressed inside the channels. Since the plating at the tops of the channels is uninhibited, the result is a plated narrowing of the channels near the tops, thereby forming the requisite reentrant surface for the grooves.

The subsequent metal-plating shown in FIG. 2C may not be necessary if the combination of the reactive ion etching process and the sputter encasing forms grooves in the polymer layer with a sufficient re-entrant surface configuration in the top portion thereof. Further, no sputtered metal is required when the layer of material has sufficient electrical and thermal conductance and mechanical strength.

The method of fabricating a heat sink with microscopic capillaries having reentrant surfaces and the resulting structure in accordance with the illustrated embodiment of the invention has proved useful in fabricating heat sinks with good thermal conductance but with surfaces that are not readily polished. The use of a polymer facilitates the requisite smooth surface for satisfactory adhesion and heat transfer, and also allows a variety of geometric configurations. The sputterencased ribs have the necessary mechanical strength as well as electrical and thermal conductance required in the heat sink.

While the invention has been described with reference to a specific embodiment, the description is illustrative of the invention and is not to be construed as limiting the invention. For example, the described grooves can be formed in a surface of a semiconductor body, in a surface of a supporting substrate or a heat sink, or two facing surfaces. The layer of material need not be a polymer but should be etchable and exhibit a planar top surface and a conforming lower surface. The metal coating provided by sputtering could be applied by vacuum deposition or by vapor phase deposition. Thus, various modifications and applications may occur to those skilled in the art without departing from the true spirit and scope of the invention as defined by the appended claims.

What is claimed is:

1. A heat sink comprising
   a body of thermally conductive material, said body having a major surface,
   a layer of a polymer material on said major surface, said polymer material having a plurality of grooves formed therein, and
   a continuous layer of metal on said polymer material and in said grooves, said layer of metal providing a thermal conductive pathway in said grooves to said body of thermally conductive material and mechanical strength for said layer of polymer material.

2. The heat sink as defined by claim 1 wherein said layer of metal and said grooves define a re-entrant surface.

3. The heat sink as defined by claim 2 wherein said major surface is uneven, said layer of polymer material providing an interface surface of sufficient smoothness to facilitate adherence to a heat source and thermal conductance therewith.

4. The heat sink as defined by claim 3 wherein said body is a ceramic material.

5. The heat sink as defined by claim 4 wherein said polymer material is a photoresist.

6. The heat sink as defined by claim 4 wherein said polymer material is polyimide.

7. The heat sink as defined by claim 2 wherein said polymer material is a photoresist.

8. The heat sink as defined by claim 2 wherein said polymer material is polyimide.

9. The heat sink as defined by claim 2 wherein said layer of metal comprises sputtered metal encasing said polymer material and plated metal over at least part of said sputtered metal.

10. The heat sink as defined by claim 3 and further including a heat generating substrate having a major surface in contact with said continuous layer of metal, and a liquid in said grooves contacting said major surface of said substrate thereby maintaining said substrate and said heat sink in low stress and high thermal conductance abutment by pressure from capillary attraction.

11. The heat sink as defined by claim 10 wherein said heat generating substrate comprises an integrated circuit.

* * * * *